US005742230A

United States Patent [19]
Kühner et al.

[11] Patent Number: 5,742,230
[45] Date of Patent: Apr. 21, 1998

[54] APPARATUS FOR TRIGGERING A WARNING DEVICE

[75] Inventors: Karl-Friedrich Kühner, Ilsfeld; Thomas Beitler, Plochingen; Thomas Schneider, Markgröningen; Gerhard Walter, Gerlingen, all of Germany

[73] Assignee: Robert Bosch GmbH, Stuttgart, Germany

[21] Appl. No.: 604,934

[22] PCT Filed: Aug. 27, 1994

[86] PCT No.: PCT/DE94/00992

§ 371 Date: May 13, 1996

§ 102(e) Date: May 13, 1996

[87] PCT Pub. No.: WO95/06928

PCT Pub. Date: Mar. 9, 1995

[30] Foreign Application Priority Data

Sep. 1, 1993 [DE] Germany ................ 9313129 U
Nov. 22, 1993 [DE] Germany ................ 9317810 U

[51] Int. Cl.⁶ .................................................. B60Q 1/00
[52] U.S. Cl. ............... 340/439; 340/458; 340/452; 340/507; 340/511; 340/815.45; 307/10.8
[58] Field of Search ..................... 340/507, 511, 340/438–441, 458–461, 451, 452, 450.2, 450.3, 815.45; 364/424.039, 424.048, 424.053, 426.021; 307/10.8; 361/49, 88

[56] References Cited

U.S. PATENT DOCUMENTS 5,515,027  5/1996  Billig et al. .................. 340/438
5,631,626  5/1997  Zydek et al. .................. 340/438

*Primary Examiner*—Jeffery Hofsass
*Assistant Examiner*—Daniel J. Wu
*Attorney, Agent, or Firm*—Kenyon & Kenyon

[57] ABSTRACT

An apparatus for triggering a warning device, in particular in a vehicle with an on-board controller to influence braking pressure and/or engine torque and/or steering as a function of the movement behavior of the vehicle wheels and/or of the vehicle, is described. In the event of a fault in the controller, ground is applied to the warning device by a control unit of the controller and the fault is thereby indicated. At least one comparator is provided, to which on the one hand a comparison voltage and on the other hand a further voltage can be applied, such that the comparator becomes conductive and applies to the warning device the ground applied to it, if the further voltage is less than a first comparison voltage and/or if the further voltage is greater than a second comparison voltage.

11 Claims, 3 Drawing Sheets

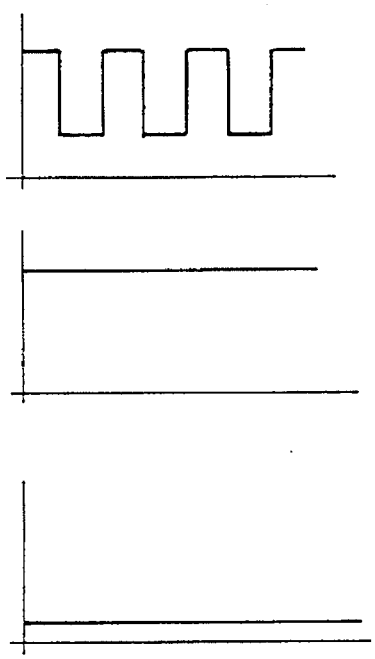
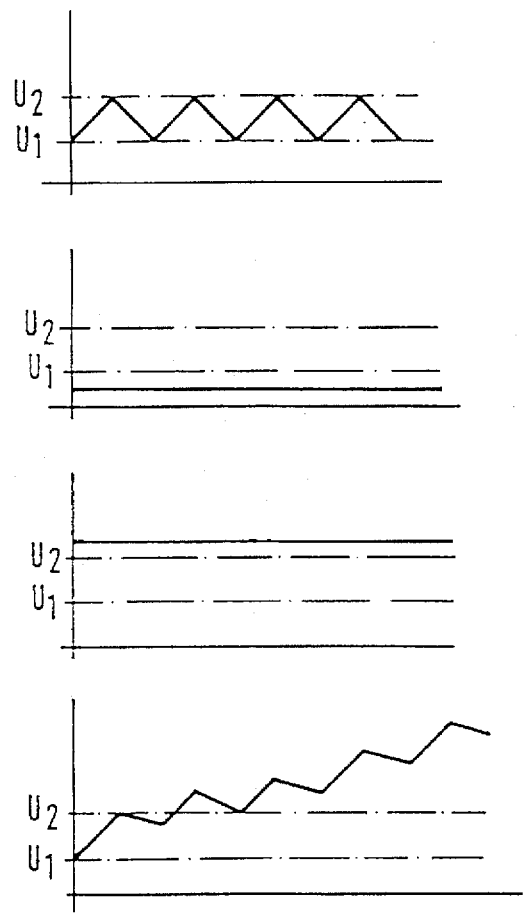
Fig. 3a    Fig. 3b
Fig. 3

APPARATUS FOR TRIGGERING A WARNING DEVICE

BACKGROUND INFORMATION

Controllers that, depending on the behavior of the vehicle wheels and/or of the vehicle, influence braking pressure and/or engine torque and/or steering, are often carried in motor vehicles. Such a controller can, for example, be an antilock braking control system, an automatic slip controller, or a vehicle dynamics controller.

With controllers of this kind, there is arranged in the driver's field of view a warning device, e.g. a warning lamp, which in the event of a fault in the controller, which might possibly even result in deactivation of the controller, is connected to ground by the control unit of the controller. The fault is thereby displayed, and the driver warned.

SUMMARY OF THE INVENTION

According to the innovation, an interruption in the control unit's ground contact is indicated; and additionally the triggering line for the warning lamp is monitored.

BRIEF DESCRIPTION OF THE DRAWINGS

FIG. 3A illustrates signals from a control unit according to an embodiment of the present invention.

FIG. 3B illustrates potentials as a function of signals from a control unit according to an embodiment of the present invention.

DETAILED DESCRIPTION OF THE INVENTION

Figure 1:
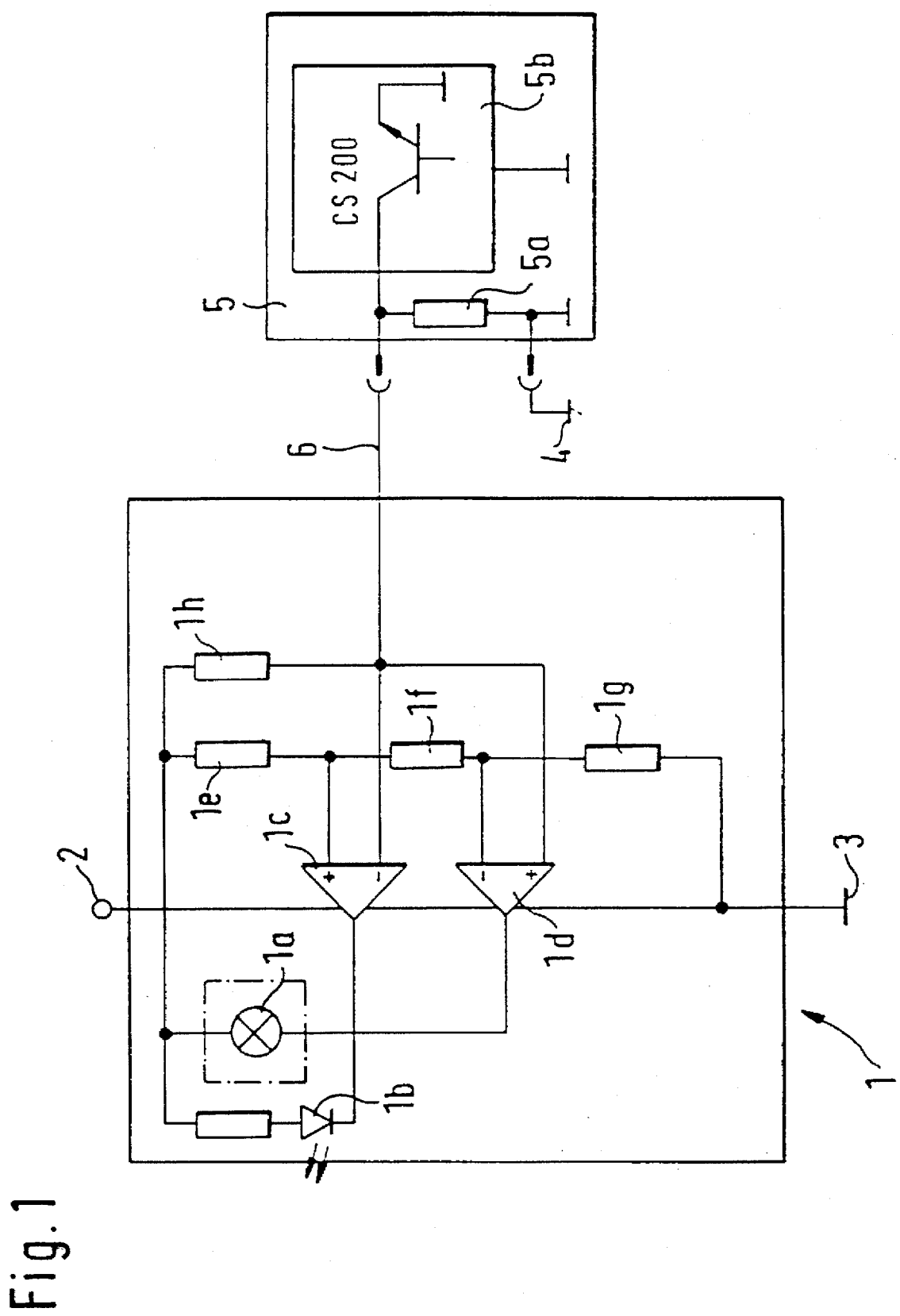
FIG. 1 illustrates a first embodiment according to the present invention.

A first exemplary embodiment of the innovation will be described with reference to FIG. 1. A block 1 is housed in the driver's vicinity, for example in the dashboard. It contains a warning device that can be implemented as a warning lamp 1a or a warning LED 1b. Block 1 further contains two comparison means 1c and 1d. Supply voltage is applied to a terminal 2. This is preferably the battery voltage applied via the ignition system.

In addition, block 1 has a ground connection 3. Located between terminal 2 and ground connection 3 is a first voltage divider consisting of resistors 1e (e.g. 10 kOhm), 1f (e.g. 10 kOhm), and 1g (e.g. 10 kOhm); by this means comparators 1c and 1d are supplied with comparison voltages. Located between terminal 2 and ground connection 4 of a remotely located control unit 5 is a second voltage divider with resistors 1h (e.g. 2 kOhm) and 5a (e.g. 2 kOhm). This voltage divider utilizes ground 4 of control unit 5.

By means of a switch 5b, the control unit can apply ground potential to the warning lamp via comparator 1d when a fault in the controller is to be indicated to the driver.

Applied to the comparator are on the one hand a comparison voltage that is made available by the first voltage divider, and on the other hand a further voltage that is made available by the second voltage divider. The comparator conducts the ground applied to it to the warning device if the further voltage is less than a first comparison voltage and/or greater than a second comparison voltage.

The voltages at the comparator are selected so that if ground contact is interrupted, if the triggering line between control unit and warning lamp breaks, and/or if the power supply lines of the control unit break, the comparators become conductive and apply to the warning device the ground applied to them.

If ground connection 4 is interrupted, the voltage at the lower (−) input of comparator 1c and at the lower (+) input of comparator 1d changes. As a result, comparator 1c conducts the ground applied to it from connection 3 to warning lamp 1a (or 1b), and illumination thereof warns the driver.

If connecting line 6 between control unit 5 and block breaks, the lower input voltages of comparators 1c and 1d then also change. Comparator 1c then also becomes conductive, and applies ground 3 to warning device 1a or 1b.

Comparator 1c thus ensures triggering of warning devices 1a or 1b in the event of an unforeseen fault (breakage of conductors 6 or 4).

When there are no faults in control unit 5 or connecting lines 4 or 6, there occurs by means of voltage divider resistors 1h and 5a, at comparators 1c and 1d, a voltage potential that does not cause either of the two to trigger warning devices 1a or 1b (normal operating state).

Figure 2:
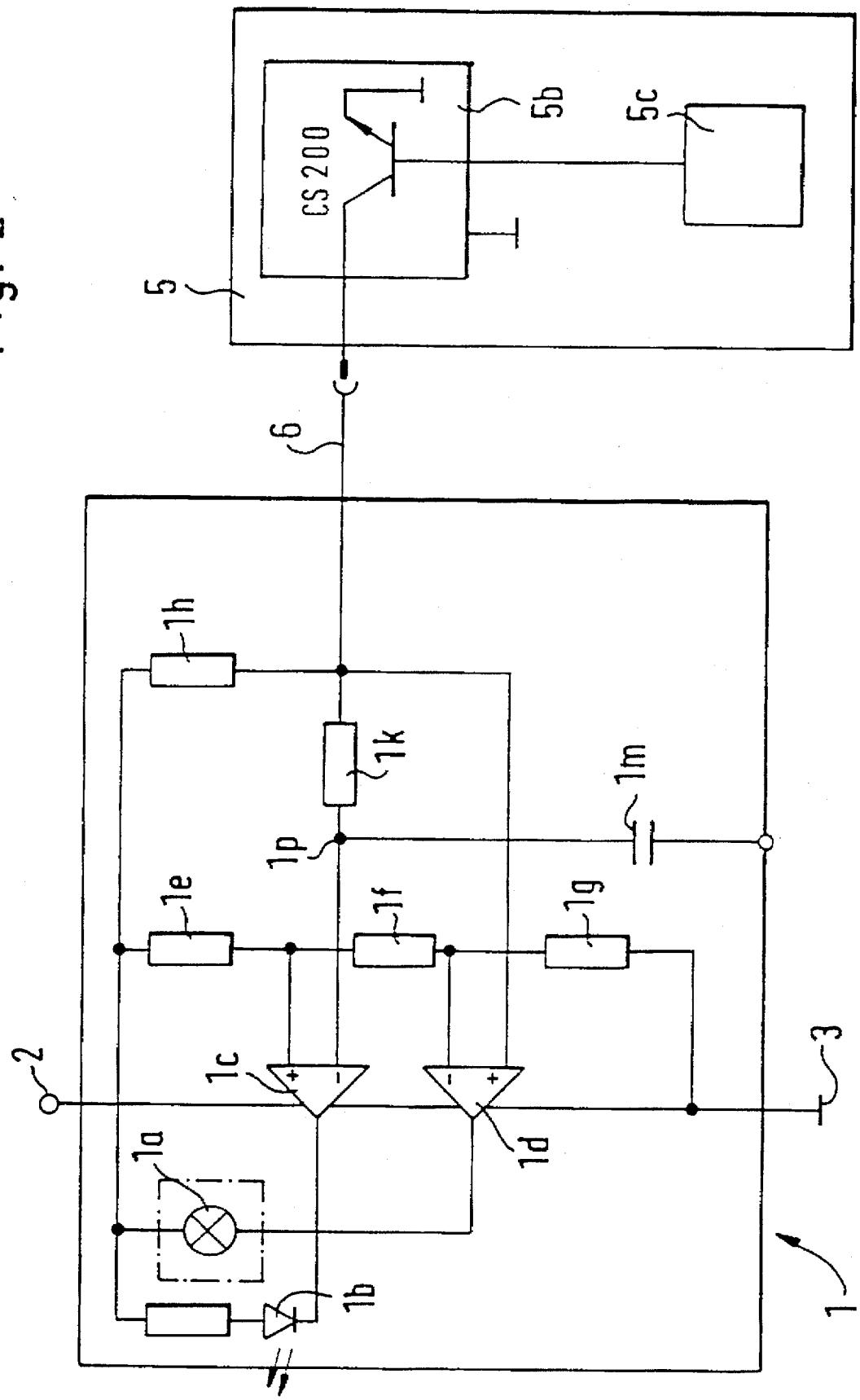
FIG. 2 illustrates a second embodiment, of the present invention.

FIG. 2 depicts a further exemplary embodiment of the device according to the invention. Corresponding elements are labeled with the same reference symbols as in FIG. 1. In contrast to FIG. 1, resistor 5a is omitted. In addition, the control unit contains a microprocessor 5c which triggers switch 5b in the control unit.

The negative contact of comparator 1c is connected via a point 1p and a resistor 1k to control unit 5. Point 1p is furthermore connected to ground via a capacitor 1m.

Microprocessor 5c triggers warning lamp 1a or 1b, via output stage 5b, with a pulse-width modulated signal. As a result of integration by resistor 1k and capacitor 1m, an average voltage value forms at point 1p. Comparators 1c and 1d compare this voltage value with the comparison value made available by the voltage divider consisting of resistors 1e, 1f, and 1g.

The series circuit consisting of resistors 1h, 1k, and capacitor 1m essentially represents a voltage divider for the pulse-width modulated signal, which replaces the voltage divider consisting of resistors 1h and 5a in FIG. 1.

FIG. 3 depicts a variety of signal sequences of this arrangement. In FIG. 3a, the output signal of microprocessor 5c is transmitted via connecting line 6 to block 1. In FIG. 3b, the potential at point 1p is transferred to ground.

The first line of FIG. 3a depicts correct operation of the control unit. This means that the signal fluctuates between a first and a second value. As depicted in the first line of FIG. 3b, this causes the potential at point 1p to fluctuate between a first value U1 and a second value U2. In this state comparators 1c and 1d do not respond. Warning devices 1a and 1b are not connected to ground 3.

If microprocessor 5c continuously emits a high signal level, or if switch 5b continuously conducts, this causes a voltage continuously less than first value U1 to be applied to point 1p. If, on the other hand, switch 5b is continuously held open, as depicted in FIG. 3a on the third line, there forms at point 1p a voltage that is continuously greater than second voltage value U2. In both these cases, the voltage at point 1p lies outside the permitted range, meaning that comparator 1c permits the flow of current through warning device 1a or 1b.

If, however, a fault occurs, especially in the control unit, in which a cycling mode is present, and the voltage at point $1p$ continuously rises or falls, warning device $1a$ or $1b$ is once again triggered so that it lights up.

The advantage of this second embodiment is that all the advantages of the first embodiment are retained, with reduced circuit complexity in control unit 5. The same faults can thus be detected with this embodiment as with the first embodiment. Furthermore this circuit arrangement is immune to short circuits and polarity reversal, since only one line is necessary between control unit and signal lamp. Furthermore the fact that the control unit is being deactivated due to overload can be indicated to the driver. Furthermore this arrangement is compatible with existing circuit arrangements, especially with the circuit arrangement depicted in FIG. 1.

It is particularly advantageous that a pulse-width modulated signal can be used to trigger the warning device.

We claim:

1. An apparatus for triggering a vehicle warning device, the warning device being coupled to a control unit of on-board controller, the apparatus comprising:

at least one comparator coupled to the control unit and to the warning device, the at least one comparator having a first input receiving one of a first comparison voltage and a second comparison voltage, a second input receiving a second voltage and an output coupled to the warning device, the at least one comparator becoming conductive when one of the second voltage is less than the first comparison voltage and the second voltage is greater than the second comparison voltage; and wherein when a fault occurs in the on-board controller, a ground signal is applied to the at least one comparator via the control unit, the output of the at least one comparator providing the ground signal to the warning device, the on-board controller controlling one of a braking pressure, an engine torque and steering as a function of a movement of the vehicle.

2. An apparatus for triggering a vehicle warning device, the warning device being coupled to a control unit of on-board controller, the apparatus comprising:

at least one comparator coupled to the control unit and to the warning device, the at least one comparator having a first input receiving one of a first comparison voltage and a second comparison voltage, a second input receiving a second voltage and an output coupled to the warning device, the at least one comparator becoming conductive when one of the second voltage is less than the first comparison voltage and the second voltage is greater than the second comparison voltage; and wherein when a fault occurs in the on-board controller, a ground signal is applied to the at least one comparator via the control unit, the output of the at least one comparator providing the ground signal to the warning device, the on-board controller controlling one of a braking pressure, an engine torque and steering as a function of a movement of wheels of the vehicle.

3. Apparatus for triggering a vehicle warning device, the warning device being coupled to a control unit of an on-board controller, the apparatus comprising:

at least one comparator coupled to the control unit and to the warning device, the at least one comparator having a first input receiving one of a first comparison voltage and a second comparison voltage, a second input receiving a second voltage and an output being coupled to the warning device, the at least one comparator becoming conductive when one of the second voltage is less than the first comparison voltage and the second voltage is greater than the second comparison voltage; and wherein when a fault occurs in the on-board controller, a ground signal is applied to the at least one comparator via the control unit, the output of the at least one comparator providing the ground signal to the warning device.

4. The apparatus according to claim 3, further comprising a first voltage divider and a second voltage divider, the first and second voltage dividers being coupled to the at least one comparator, the first and the second comparison voltages being generated via the first voltage divider, the second voltage being generated via the second voltage divider, the second voltage divider being coupled to a second ground connection of the control unit.

5. The apparatus according to 3, wherein when at least one of a ground connection of the control unit is interrupted, a triggering line between the control unit and the warning device is interrupted, and a power supply line of the control unit is interrupted, the at least one comparator becomes conductive and provides the ground signal to the warning device, the ground signal being generated as a function of a first ground connection coupled to the first voltage divider.

6. The apparatus according to claim 4, wherein the first voltage divider includes three resistors connected in series between a power supply and a first ground connection coupled to the first voltage divider.

7. The apparatus according to claim 4, wherein the second voltage divider includes two resistors connected in series between a power supply and the second ground connection of the control unit.

8. The apparatus according to claim 4, wherein the second voltage divider includes two resistors and a capacitor connected in series between a power supply and a first ground connection coupled to the first voltage divider.

9. The apparatus according to claim 4, wherein that the first and second voltage dividers and the at least one comparator are disposed adjacent to the warning device.

10. The apparatus according to claim 5, wherein the warning device is arranged in a field of view of the driver.

11. The apparatus according to claim 3, wherein the warning device is activated as a function of a pulse-width modulated signal.

* * * * *